(12) United States Patent
Ausserlechner

(10) Patent No.: US 11,678,588 B2
(45) Date of Patent: Jun. 13, 2023

(54) HALL DEVICE

(71) Applicant: Infineon Technologies AG, Neubiberg (DE)

(72) Inventor: Udo Ausserlechner, Villach (AT)

(73) Assignee: Infineon Technologies AG, Neubiberg (DE)

(*) Notice: Subject to any disclaimer, the term of this patent is extended or adjusted under 35 U.S.C. 154(b) by 382 days.

(21) Appl. No.: 16/948,739

(22) Filed: Sep. 30, 2020

(65) Prior Publication Data
US 2021/0111336 A1 Apr. 15, 2021

(30) Foreign Application Priority Data
Oct. 11, 2019 (DE) .......................... 102019127413.3

(51) Int. Cl.
*H10N 52/00* (2023.01)
*H03K 17/90* (2006.01)
*H10N 52/80* (2023.01)
*G01R 33/07* (2006.01)
*G01R 33/00* (2006.01)
(Continued)

(52) U.S. Cl.
CPC ........ *H01L 43/065* (2013.01); *G01R 33/0041* (2013.01); *G01R 33/07* (2013.01); *G01R 33/075* (2013.01); *H01L 43/04* (2013.01); *H03K 17/90* (2013.01); *G01R 33/0029* (2013.01)

(58) Field of Classification Search
CPC ......... H01L 43/02; H01L 43/04; H01L 43/06; H01L 43/065; H01L 43/12; H01L 27/22; H01L 27/226; G01R 33/077; G01R 33/07; G01R 33/0029; G01R 33/0017; G01R 33/0052; G01R 33/0206; G01R 33/066;
(Continued)

(56) References Cited

U.S. PATENT DOCUMENTS 6,611,137 B2 8/2003 Haensgen et al.
2005/0230770 A1* 10/2005 Oohira .................... H01L 43/14
257/421
(Continued)

FOREIGN PATENT DOCUMENTS

EP 3367110 A1 8/2018

OTHER PUBLICATIONS

Ausserlechner U., "Hall Effect Devices with Three Terminals: Their Magnetic Sensitivity and Offset Cancellation Scheme", Journal of Sensors, vol. 2016, 16 pages.
(Continued)

*Primary Examiner* — Jose R Diaz
(74) *Attorney, Agent, or Firm* — Harrity & Harrity, LLP

(57) ABSTRACT

A Hall effect device includes a semiconductor region and at least three contacts to the semiconductor region, which are arranged in the semiconductor region substantially along a line or curve. The line or curve functionally separates the semiconductor region in a first region and a second region. The Hall effect device further including a first electrode that is electrically isolated against the first region and a second electrode that is electrically isolated against the second region. Two of the at least three contacts supply electric energy to the first region and to the second region, and the remaining at least one contact taps an output signal of the first region and/or the second region that responds to a magnetic field component.

13 Claims, 5 Drawing Sheets

(51) Int. Cl.
*H01L 43/06* (2006.01)
*H01L 43/04* (2006.01)

(58) Field of Classification Search
CPC ... G01R 33/0005; G01R 33/075; H03K 17/90
See application file for complete search history.

(56) References Cited

U.S. PATENT DOCUMENTS

| | | | | |
|---|---|---|---|---|
| 2007/0290682 | A1* | 12/2007 | Oohira | G01R 33/075 257/E43.003 |
| 2020/0365796 | A1* | 11/2020 | Vecchi | H01L 43/06 |
| 2021/0063204 | A1* | 3/2021 | Bondar | G01B 7/30 |

OTHER PUBLICATIONS

Munter P.J.A., "Electronic Circuitry for a Smart Spinning-current Hall Plate with Low Offset", Sensors and Actuators A, vol. 25-27, pp. 747-751.

Popovic R.S., "Hall Effect Devices: Second Edition", Series in Sensors, 2004, pp. 282-286.

* cited by examiner

HALL DEVICE

CROSS REFERENCE TO RELATED APPLICATION

This application claims priority to German Patent Application No. 102019127413.3 filed on Oct. 11, 2019, the content of which is incorporated by reference herein in its entirety.

BACKGROUND

Existing Hall effect devices suffer from offset errors.

Spinning current (also referred to as connection-commutation) schemes may cancel the offset voltage of a Hall device. A rotation symmetric Hall device may be alternately biased in two orthogonal directions, which results in the offset voltage changing the sign, whereas the Hall voltage does not.

However, existing spinning current schemes may limit the bandwidth of the Hall signal path.

SUMMARY

The examples suggested herein may in particular be based on at least one of the following implementations. Combinations of the following features may be utilized to reach a result. The features of the method could be combined with any feature(s) of the device, apparatus or system or vice versa.

A Hall effect device comprising
a semiconductor region,
at least three contacts to the semiconductor region, which are arranged in the semiconductor region substantially along a line or curve, wherein the line or curve functionally separates the semiconductor region in a first region and a second region,
a first electrode that is electrically isolated against the first region
a second electrode that is electrically isolated against the second region,
wherein the first electrode is configured to activate or deactivate the first region,
wherein the second electrode is configured to activate or deactivate the second region,
wherein two of the at least three contacts supply electric energy to the first region and to the second region,
wherein the remaining at least one contact taps an output signal of the first region and/or the second region that responds to a magnetic field component affecting the Hall effect device.

The remaining at least one contact may in particular subsequently tap the output signals of the first region and the second region.

The first electrode and the second electrode may each be realized as a pole plate. The electric isolation of the first electrode and the second electrode against the respective region can be achieved via a dielectric layer or via pn junction in blocking direction as used in JFETs.

The first electrode and the first region establish a first Hall plate and the second electrode and the second region establish a second Hall plate.

The remaining at least one contact may in particular be arranged to determine a voltage that depends on the size of the magnetic field component that is perpendicular to the Hall regions of the Hall effect device.

The "separation" of the semiconductor region in the first region and the second region refers to a logical separation that can be identified based on the line or curve. In other words: Pursuant to the line or curve results the first region on one side of the line or curve and the second region on the other side of the line or curve. It is noted that the line may be but does not have to be a straight line.

Substantially along a line or curve may refer to a predetermined range or strip along the line or curve.

It is noted that the electrodes may have rectangular, circular or any other shape.

It is further noted that at least four contacts may be provided, two of the contacts supplying electric energy and the other two contacts tapping voltages that are correlated with the magnetic field to be determined.

The at least three contacts may be arranged on a line or on a curve (e.g., circle or ellipse) defining the border between the first region and the second region. Each electrode may be driven via a terminal, which may also be referred to as gate terminal.

According to an implementation, the first region and the second region are alternately activated and deactivated.

Such activation and deactivation is achieved by applying different electrical potentials on the respective electrodes. Hence, the Hall regions are alternately activated and deactivated.

According to an implementation, the at least three contacts are integrated in the semiconductor region, but with a different material and/or doping compared to the semiconductor region.

The contacts may have an $n^+$ doping. They may be located in the bulk of the semiconductor region, which may be $p^-$ doped. Hence, the bulk and the contact region may be of different doping and of different semiconductor material. For example, arsenic or phosphorus may be used to generate n doping, whereas boron may be used to provide p doping. A contact may in particular be doped such that an ohmic connection towards the metallic connection lead as well as towards the inversion channel is achieved. The contact may thus have a doping amounting to, e.g., $10^{20}/cm^3$ or $10^{21}/cm^3$, whereas the inversion channel may have a lower doping in a range of, e.g., $10^{16}/cm^3$ to $10^{18}/cm^3$.

According to an implementation, the device comprises at least two contacts to activate and/or deactivate the first Hall region and the second Hall region.

According to an implementation,
the first electrode is activated and the second electrode is deactivated for a first duration, and
the first electrode is deactivated and the second electrode is activated for a second duration.

According to an implementation, the first duration and the second duration are defined by a rectangular pulse signal or a sinusoidal signal with a frequency $f_0$.

According to an implementation, an output signal is determined based on a signal obtained via the remaining at least one contact, which signal is demodulated with the rectangular pulse signal or the sinusoidal signal.

According to an implementation, the signal obtained via the remaining at least one contact is filtered and/or amplified before it is demodulated.

According to an implementation, the at least three contacts are arranged substantially along a straight line.

According to an implementation, the at least three contacts are arranged substantially on a circle line, wherein the at least three contacts are substantially evenly distributed along the circle line.

According to an implementation, the at least three contacts are switched pursuant to a spinning current scheme.

In addition, a method is provided for operating a Hall device
wherein the Hall device comprises
a semiconductor region,
at least three contacts to the semiconductor region, which are arranged in the semiconductor region substantially along a line or curve, wherein the line or curve functionally separates the semiconductor region in a first region and a second region,
a first electrode that is electrically isolated against the first region
a second electrode that is electrically isolated against the second region,
comprising the steps
activating or deactivating the first region via the first electrode,
activating or deactivating the second region via the second electrode,
supplying electric energy to the first region and to the second region by two of the at least three contacts,
tapping by the remaining at least one contact an output signal of the first region and/or the second region that responds to a magnetic field component affecting the Hall effect device.

According to an implementation, the method further comprises:
determining the output signal based on a signal obtained via the remaining at least one contact, which signal is demodulated with a rectangular pulse signal or a sinusoidal signal, which is also used to drive the first electrode and the second electrode in an alternating manner.

BRIEF DESCRIPTION OF THE DRAWINGS

Implementations are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
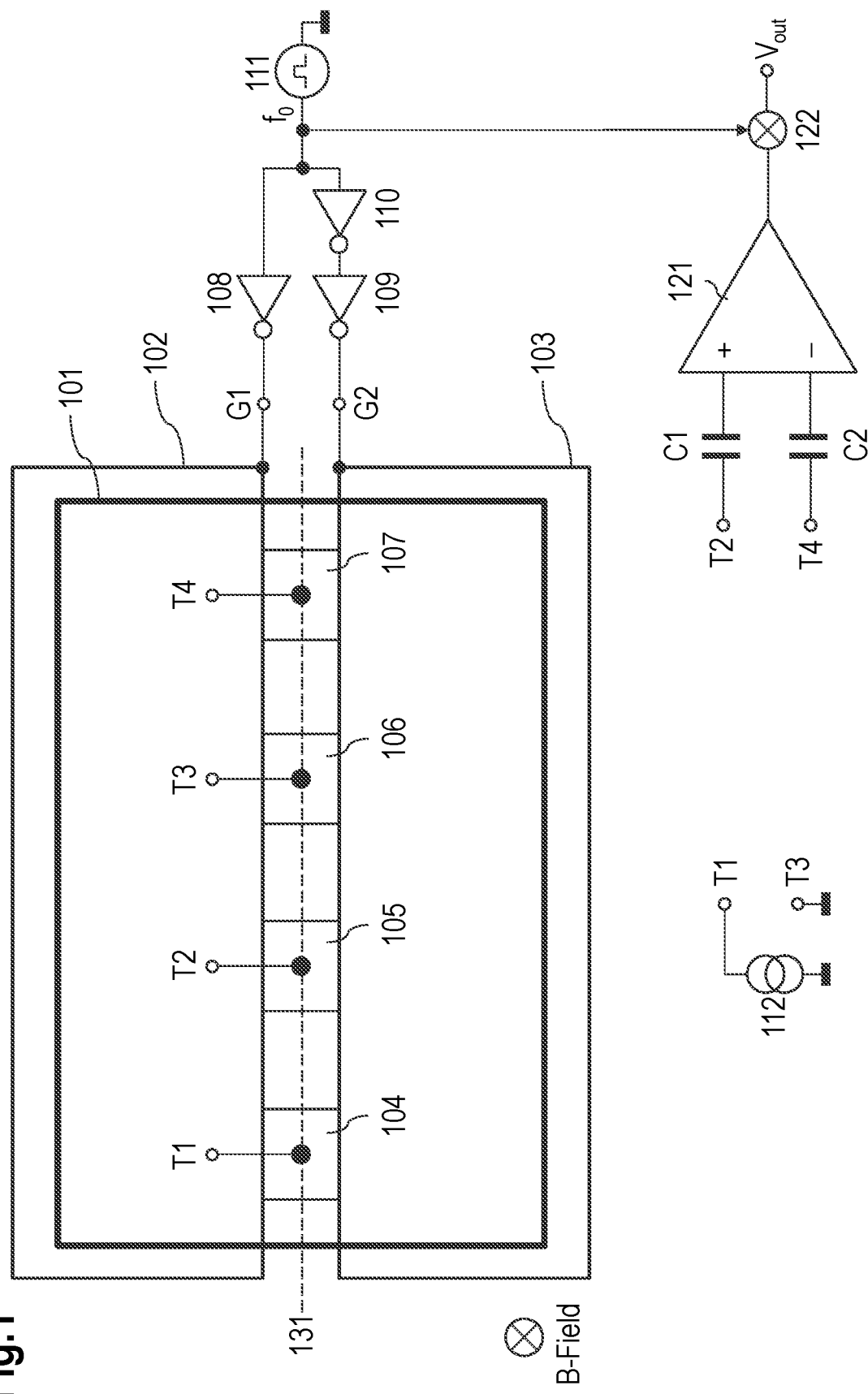
FIG. 1 shows an example schematic layout view (top view) of a Hall region comprising a bulk area, terminals and pole plates.

FIG. 1 shows an example schematic layout view (top view) of a Hall region comprising a bulk area 101 with four regions 104 to 107.

The bulk area 101 may be low p-doped similar to a CMOS p-well in silicon technology. The regions 104 to 107 each has an $n^+$ doping. The region 104 is accessible via a contact T1, the region 105 is accessible via a contact T2, the region 106 is accessible via a contact T3 and the region 107 is accessible via a contact T4.

On top of the bulk area 101, two pole plates 102 and 103 (also referred to as electrodes) are arranged, wherein the pole plate 102 is connected to a terminal G1 and the pole plate 103 is connected to a terminal G2. The terminals G1 and G2 may be regarded as gates and the regions 104 to 107 may each be regarded as drain-source regions.

The combination of bulk area 101, regions 104 to 107 and pole plates 102, 103 can be regarded as Hall region.

In the example shown in FIG. 1, a magnetic field (B-Field) affects the Hall region, wherein the direction of the B-Field is perpendicular to the drawing plane, pointing towards the Hall region. The B-Field may cover the whole Hall device shown in FIG. 1.

The contacts T1 to T4 may be arranged on (or along) a symmetry line 131 of the Hall region thereby dividing the Hall region in a first (upper) area and a second (lower) area. The first area is covered by the pole plate 102 and the second area is covered by the pole plate 103.

The pole plate 102 and the pole plate 103 each is isolated with a thin dielectric from the bulk area 101 so that the potential of each pole plate 102, 103 controls the charge in the Hall region (comparable to an NMOS transistor). The pole plates 102, 103 may thus correspond to the gate electrode of such NMOS transistor.

The operation of the device can be described as follows:
A current $I_0$ is injected via a current source 112 in the contact T1, wherein the contact T3 is connected to ground.

Voltages are tapped via the contacts T2 and T4.

A generator 111 supplies a rectangular pulse voltage with a frequency $f_0$, which is supplied via a single inverter 108 to the terminal G1 and via a series connection of two inverters 109, 110 to the terminal G2.

Each of the inverters 108 to 110 supplies an inverted signal, wherein two inverters connected in series supply substantially the original signal. In addition, each inverter 108 to 110 may be a driver that allows a higher current level at its output.

The arrangement of the inverters 108 to 110 depicted in FIG. 1 is an example solution that ensures that the signals at the terminals G1 and G2 are inverse to each other: whenever the signal at the terminal G1 is high, the signal at the terminal G2 is low and vice versa.

If the terminal G1 is high, the Hall region below the pole plate 102 is active (conducting). At the same time, the terminal G2 is low and the Hall region below the pole plate 103 is inactive (not conducting). The B-Field perpendicular to the Hall region, results in a voltage at the contact T2 being larger than a voltage at the contact T4.

In a second operating phase, the terminal G1 is low and the terminal G2 is high. The Hall region below the pole plate 102 is inactive and the Hall region below the pole plate 103 is active.

Since the contacts T1 to T4 are located on the upper edge of the terminal G2 but on the lower edge of the terminal G1, the Hall signal changes its sign: The potential at the contact T2 is smaller than the potential at the contact T4.

Thus, the voltage between the contact T2 and the contact T4 oscillates between two values, which become larger when the magnetic field (B-Field) increases. As long as the two halves (defined by the pole plates 102, 103) of the Hall region are symmetric to the contacts T1 to T4, there is no (significant) offset.

The contact T2 is connected via a capacitor C1 to the positive input terminal of an operational amplifier 121 and the contact T4 is connected via a capacitor C2 to the negative input of the operational amplifier 121. The capacitors C1, C2 ensure that the DC components in the signals conveyed via the contacts T2, T4 are reduced or filtered out. The output signal of the operational amplifier 121 is demodulated via a demodulator 122 using the frequency $f_0$ of the generator 111 thereby supplying a Hall signal $V_{out}$ that is proportional to the magnetic field (B-Field) applied to the Hall region.

As an option, a low-pass filter may be added to suppress glitches which may be injected into the signal path via the terminals G1 and G2.

This approach bears the advantage that the signal path, e.g. the path from the contacts T2, T4 towards the Hall signal $V_{out}$ is not chopped in the low-voltage domain (e.g. left of the operational amplifier 121). Hence, the frequency $f_0$ can be high compared to solutions of the prior art.

The approach presented may be combined with known spinning schemes. In such case, the contacts T1 to T4 may be connected to switches, which exchange the role of supply terminals and signal terminals, e.g., periodically. In the example shown in FIG. 1, the contacts T1 and T2 may be periodically switched together with the contacts T3 and T4. Such periodically switching of the terminals may preferably occur with a frequency that is smaller than or equal to the frequency $f_0$.

Figure 2:
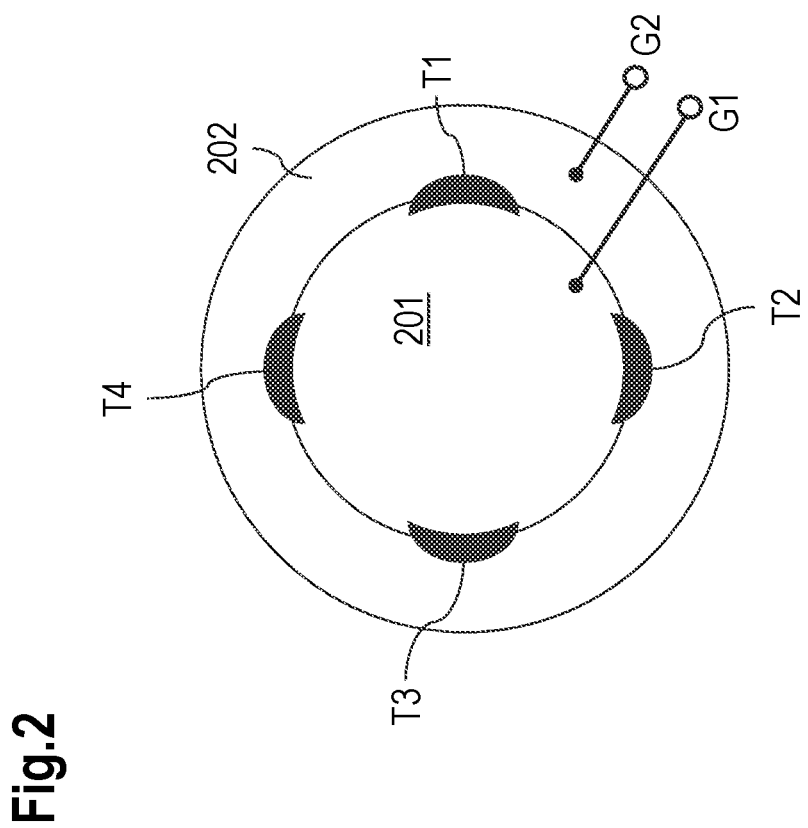
FIG. 2 shows an alternative layout, wherein the terminals are arranged substantially on a circle line.

FIG. 2 shows a top view of an alternative implementation comprising an inner disc 201 and an outer ring 202. The inner disc 201 corresponds to the first pole plate and the outer ring 202 corresponds to the second pole plate. The inner disc 201 is connected to a terminal G1 and the outer ring 202 is connected to a terminal G2.

Contacts T1 to T4 are substantially equally distributed across the circumference of the inner disc 201, which is the curve between the inner disc 201 and the outer ring 202.

It is noted that the bulk area is below the structure shown in FIG. 2 and that the pole plates are isolated with a thin dielectric from the bulk area so that the potential of each of the pole plates may control the charge in the Hall region.

Figure 3:
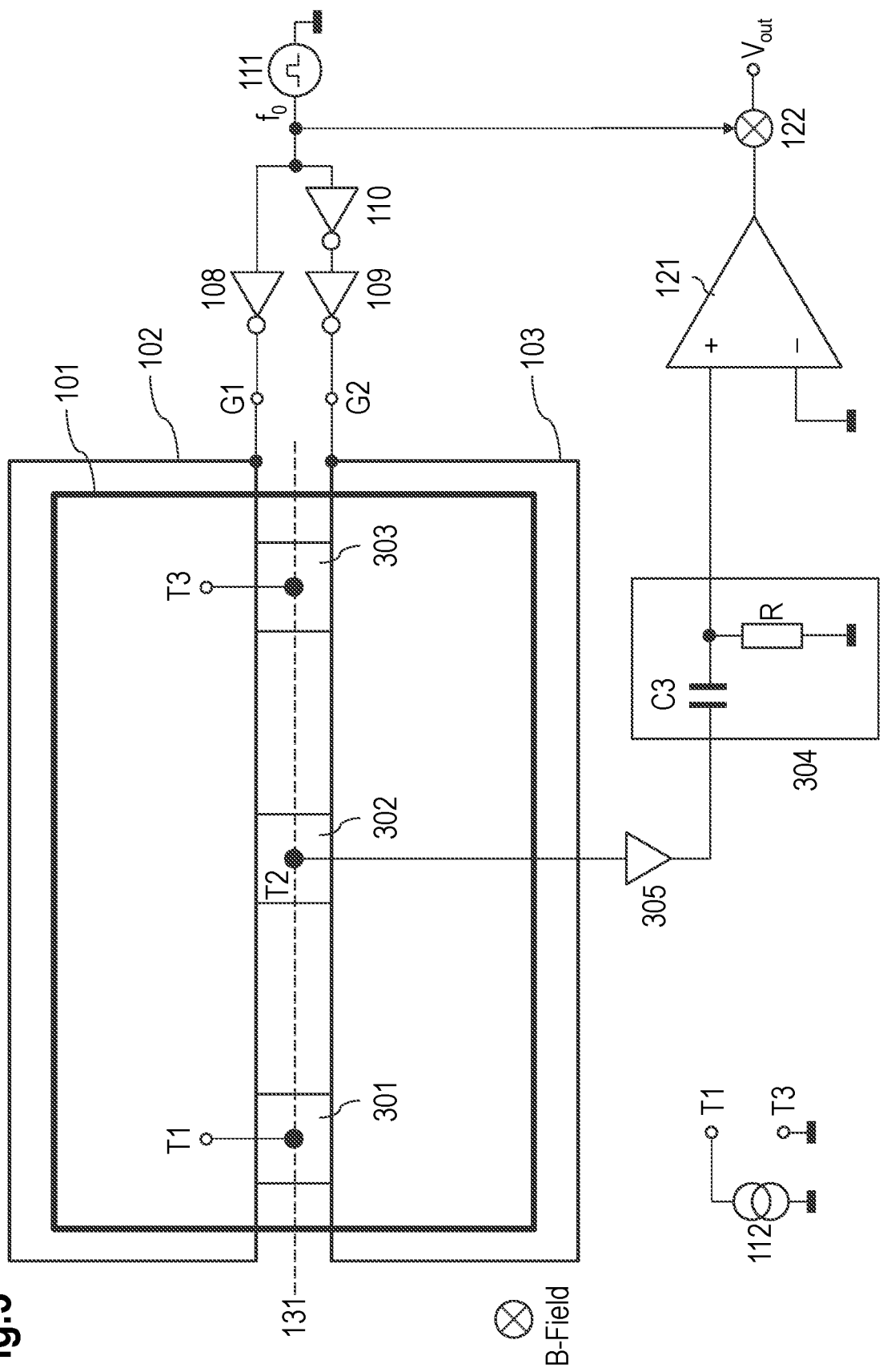
FIG. 3 shows an alternative implementation of FIG. 1 comprising three contacts that are implemented in three regions of the bulk area.

FIG. 3 shows an alternative implementation based on FIG. 1 with three regions 301 to 303 and three contacts T1, T2 and T3 instead of the four regions and four contacts shown in FIG. 1.

The contact T1 is connected to the current source 112 and the contact T3 is connected to ground. The contact T2 is connected via an optional buffer 305 and a high-pass filter 304 to the positive input of the operational amplifier 121. The negative input of the operational amplifier 121 is connected to ground.

The high-pass filter 304 may comprise a capacitor C3 and a resistor R, which build an RC-high pass of first order.

Figure 4A:
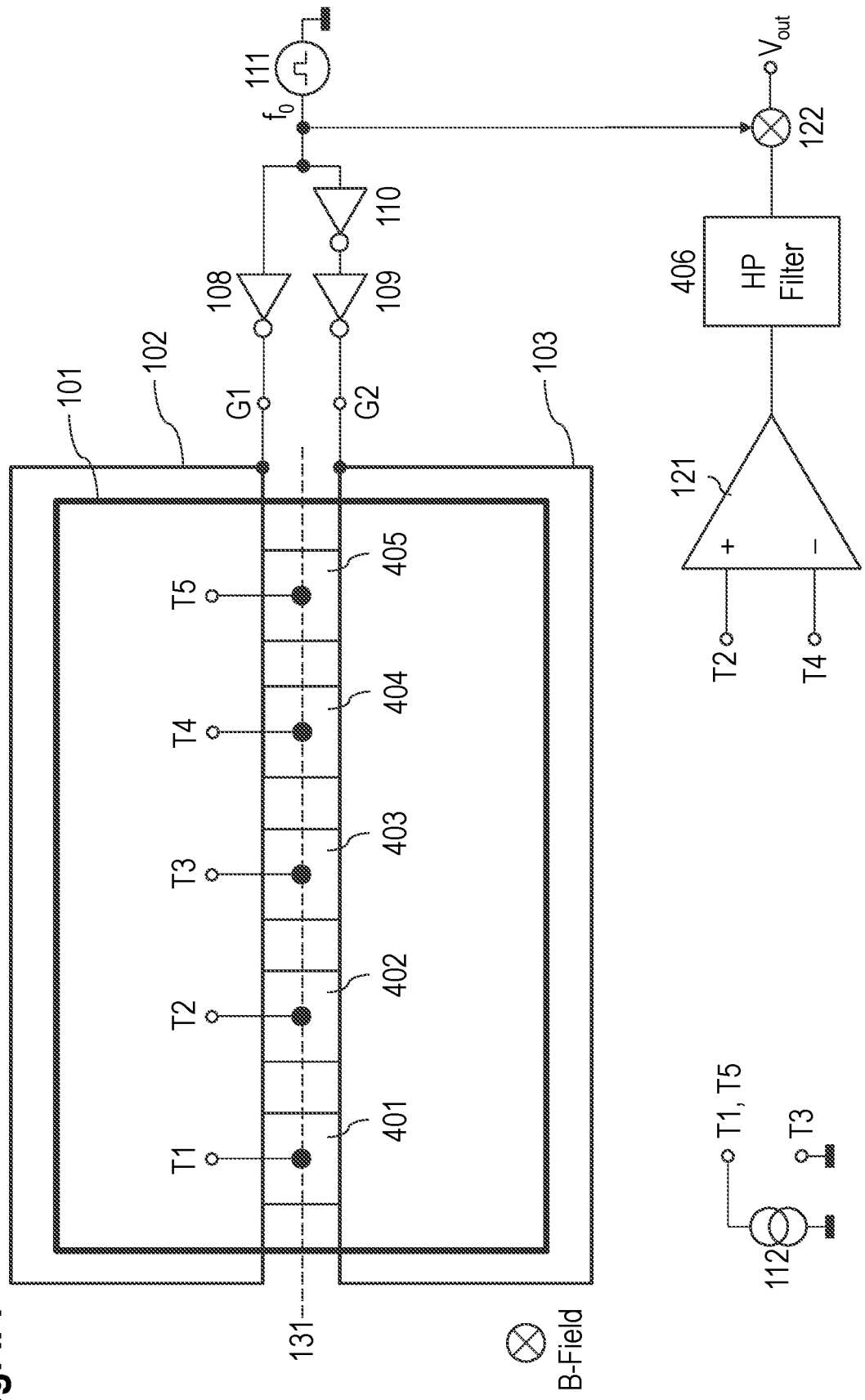
FIG. 4A shows a first phase of a spinning scheme with five contacts.
Figure 4B:
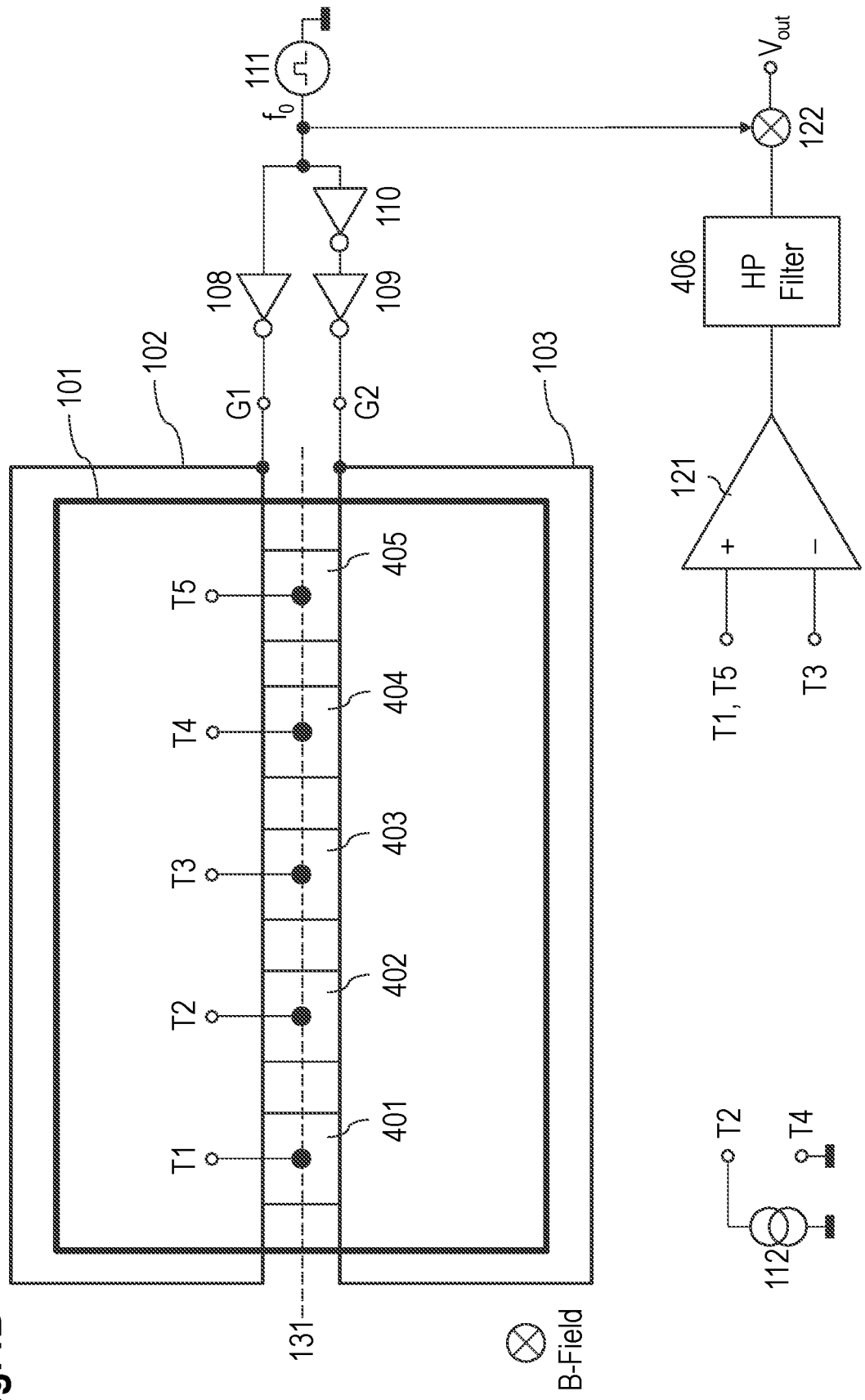
FIG. 4B shows a second phase of a spinning scheme with five contacts.

FIG. 4A and FIG. 4B show an alternative implementation also based on FIG. 1 with five regions 401 to 405 and five contacts T1 to T5.

FIG. 4A shows a first phase of a spinning scheme and FIG. 4B shows a second phase of a spinning scheme. In each phase, the contacts T1 to T5 are connected (switched) differently towards the current source 112 and the operational amplifier 121.

In the first phase shown in FIG. 4A, the contacts T1 and T5 are connected to the current source 112 and the contact T3 is connected to ground. The contact T2 is connected to the positive input of the operational amplifier 121 and the contact T4 is connected to the negative input of the operational amplifier 121.

In the second phase shown in FIG. 4B, the contact T2 is connected to the current source 112 and the contact T4 is connected to ground. The contacts T1 and T5 are both connected to the positive input of the operational amplifier 121 and the contact T3 is connected to the negative input of the operational amplifier 121.

In contrast to FIG. 1, FIG. 4A and FIG. 4B do not have the capacitors C1 and C2, but a high-pass filter 406 is arranged between the output of the operational amplifier 121 and the demodulator 122.

Several phases (also phases different to the ones shown and explained above) can be realized to enable the benefits of spinning current schemes.

Although various example implementations of the implementation have been disclosed, it will be apparent to those skilled in the art that various changes and modifications can be made which will achieve some of the advantages of the implementation without departing from the spirit and scope of the implementation. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the implementation may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A Hall effect device comprising
   a semiconductor region,
   at least three contacts to the semiconductor region,
      wherein the at least three contacts are arranged in the semiconductor region substantially along a line or curve, and
      wherein the line or curve functionally separates the semiconductor region in a first region and a second region,
   a first electrode that is electrically isolated against the first region,
   a second electrode that is electrically isolated against the second region,
      wherein the first electrode is configured to activate or deactivate the first region, and
      wherein the second electrode is configured to activate or deactivate the second region,
   wherein two contacts of the at least three contacts supply electric energy to the first region and to the second region,
   wherein a remaining at least one contact, of the at least three contacts, taps an output signal of at least one of the first region or the second region that responds to a magnetic field component affecting the Hall effect device.

2. The Hall effect device according to claim 1, wherein the first region and the second region are alternately activated and deactivated.

3. The Hall effect device according to claim 1, wherein the at least three contacts are integrated in the semiconductor region and with at least one of a different material or doping compared to the semiconductor region.

4. The Hall effect device according to claim 3, wherein
   the first electrode is activated and the second electrode is deactivated for a first duration, and
   the first electrode is deactivated and the second electrode is activated for a second duration.

5. The Hall effect device according to claim 4, wherein the first duration and the second duration are defined by a rectangular pulse signal or a sinusoidal signal with a frequency $f_0$.

6. The Hall effect device according to claim 5, wherein the output signal is determined based on a signal obtained via the remaining at least one contact,
  wherein the signal is demodulated with the rectangular pulse signal or the sinusoidal signal.

7. The Hall effect device according to claim 5, wherein the signal obtained via the remaining at least one contact is at least one of filtered and/oror amplified before the signal is demodulated.

8. The Hall effect device according to claim 1, comprising at least two contacts to at least one of activate or deactivate the first region and the second region.

9. The Hall effect device according to claim 1, wherein the at least three contacts are arranged substantially along a straight line.

10. The Hall effect device according to claim 1, wherein the at least three contacts are arranged substantially on a circle line, wherein the at least three contacts are substantially evenly distributed along the circle line.

11. The Hall effect device according to claim 1, wherein the at least three contacts are switched pursuant to a spinning current scheme.

12. A method for operating a Hall device,.
  wherein the Hall device comprises:
    a semiconductor region,
    at least three contacts to the semiconductor region,
      wherein the at least three contacts are arranged in the semiconductor region substantially along a line or curve, and
      wherein the line or curve functionally separates the semiconductor region in a first region and a second region,
    a first electrode that is electrically isolated against the first region, and
    a second electrode that is electrically isolated against the second region,
  wherein the method comprises:
    activating or deactivating the first region via the first electrode,
    activating or deactivating the second region via the second electrode,
    supplying electric energy to the first region and to the second region by two contacts of the at least three contacts,
    tapping by a remaining at least one contact, of the at least three contacts, an output signal of at least one of the first region or the second region that responds to a magnetic field component affecting the Hall device.

13. The method according to claim 12, further comprising:
  determining the output signal based on a signal obtained via the remaining at least one contact,
    wherein the signal is demodulated with a rectangular pulse signal or a sinusoidal signal, which is also used to drive the first electrode and the second electrode in an alternating manner.

* * * * *

UNITED STATES PATENT AND TRADEMARK OFFICE
CERTIFICATE OF CORRECTION

| | |
|---|---|
| PATENT NO. | : 11,678,588 B2 |
| APPLICATION NO. | : 16/948739 |
| DATED | : June 13, 2023 |
| INVENTOR(S) | : Udo Ausserlechner |

It is certified that error appears in the above-identified patent and that said Letters Patent is hereby corrected as shown below:

In the Claims

Claim 7:
Column 7, Line 8, change "least one of filtered and/oror amplified before the signal is" to --least one of filtered or amplified before the signal is--

Signed and Sealed this
First Day of October, 2024

Katherine Kelly Vidal
Director of the United States Patent and Trademark Office